US009966491B2

(12) United States Patent
Chandrashekhar et al.

(10) Patent No.: US 9,966,491 B2
(45) Date of Patent: May 8, 2018

(54) OPTICALLY SWITCHED GRAPHENE/4H-SIC JUNCTION BIPOLAR TRANSISTOR

(71) Applicant: University of South Carolina, Columbia, SC (US)

(72) Inventors: MVS Chandrashekhar, Columbia, SC (US); Tangali S. Sudarshan, Columbia, SC (US); Sabih U. Omar, West Columbia, SC (US); Gabriel Brown, Lexington, SC (US); Shamaita S. Shetu, West Columbia, SC (US)

(73) Assignee: University of South Carolina, Columbia, SC (US)

( * ) Notice: Subject to any disclaimer, the term of this patent is extended or adjusted under 35 U.S.C. 154(b) by 0 days. days.

(21) Appl. No.: 15/049,743

(22) Filed: Feb. 22, 2016

(65) Prior Publication Data

US 2016/0315211 A1 Oct. 27, 2016

Related U.S. Application Data

(60) Provisional application No. 62/118,551, filed on Feb. 20, 2015.

(51) Int. Cl.
| | | |
|---|---|---|
| *H01L 27/095* | (2006.01) | |
| *H01L 31/11* | (2006.01) | |
| *H01L 31/028* | (2006.01) | |
| *H01L 31/0224* | (2006.01) | |
| *H01L 31/18* | (2006.01) | |

(52) U.S. Cl.
CPC ........ *H01L 31/1105* (2013.01); *H01L 31/028* (2013.01); *H01L 31/022408* (2013.01); *H01L 31/1804* (2013.01); *Y02E 10/547* (2013.01)

(58) Field of Classification Search
CPC ............ H01L 31/1105; H01L 31/1816; H01L 31/022408; H01L 31/028
(Continued)

(56) References Cited

U.S. PATENT DOCUMENTS 5,086,324 A * 2/1992 Hagino ............... H01L 29/0834
257/378
2008/0246082 A1* 10/2008 Hshieh .............. H01L 29/66727
257/333

(Continued)

OTHER PUBLICATIONS

Coletti C, Forti S, Principi A, Emtsev KV, Zakharov AA, Daniels KM, Daas BK, Chandrashekhar MV, Ouisse T, Chaussende D, MacDonald AH. Revealing the electronic band structure of trilayer graphene on SiC: An angle-resolved photoemission study. Physical Review B. Oct. 29, 2013;88(15):155439.

(Continued)

*Primary Examiner* — Thien F Tran
(74) *Attorney, Agent, or Firm* — Dority & Manning, P.A.

(57) ABSTRACT

A bi-polar device is provided, along with methods of making the same. The bi-polar device can include a semiconductor substrate doped with a first dopant, a semiconductor layer on the first surface of the semiconductor substrate, and a Schottky barrier layer on the semiconductor layer. The method of forming a bi-polar device can include: forming a semiconductor layer on a first surface of a semiconductor substrate, where the semiconductor substrate comprises a first dopant and where the semiconductor layer comprises a second dopant that has an opposite polarity than the first dopant; and forming a Schottky barrier layer on a first portion of the semiconductor layer while leaving a second portion of the semiconductor layer exposed.

25 Claims, 16 Drawing Sheets

(58) Field of Classification Search
USPC .... 257/77, 47, 197, 205, 273, 462, 477, 478
See application file for complete search history.

(56) References Cited

U.S. PATENT DOCUMENTS

2012/0031477 A1* 2/2012 Fogel ............... H01L 31/02246
136/255
2015/0368827 A1 12/2015 Sudarshan et al.

OTHER PUBLICATIONS

Seyller T, Emtsev KV, Speck F, Gao KY, Ley L. Schottky barrier between 6 H—Si C and graphite: Implications for metal/SiC contact formation. Applied physics letters. Jun. 12, 2006;88(24):242103.

Shetu SS. Omar SU, Daniels KM, Daas B, Andrews J. Ma S, Sudarshan TS, Chandrashekhar MV. Si-adatom kinetics in defect mediated growth of multilayer epitaxial graphene films on 6H—SiC. Journal of Applied Physics. Oct. 28, 2013;114(16):164903.

Daas BK, Daniels KM, Sudarshan TS, Chandrashekhar MV. Polariton enhanced infrared reflection of epitaxial graphene. Journal of Applied Physics. Dec. 1, 2011;110(11):113114.

Sze SM, Ng KK. Physics of semiconductor devices. John Wiley & sons; Nov. 3, 2006.

Rana T, Chandrashekhar MV, Sudarshan TS. Vapor phase surface preparation (etching) of 4H—SiC substrates using tetrafluorosilane ($SiF_4$) in a hydrogen ambient for SiC epitaxy. Journal of Crystal Growth, Oct. 1, 2013;380:61-7.

Amemiya Y, Mizushima Y. Bipolar-mode Schottky contact and applications to high-speed diodes. IEEE Transactions on Electron Devices. Jan. 1984;31(1):35-42.

* cited by examiner

OPTICALLY SWITCHED GRAPHENE/4H-SIC JUNCTION BIPOLAR TRANSISTOR

PRIORITY INFORMATION

The present application claims priority to U.S. Provisional Patent Application Ser. No. 62/118,551 titled "Optically Switched Graphene/4H—SiC Junction Bipolar Transistor" of Chandrashekhar, et al. filed on Feb. 20, 2015, the disclosure of which is incorporated by reference herein.

GOVERNMENT SUPPORT CLAUSE

This invention was made with government support under ECCS-EPMD Award No. 1309466 awarded by the National Science Foundation, under 12-3834 awarded by the Nuclear Energy University Program, Department of Energy, and under N000141010530 awarded by the Office of Naval Research. The government has certain rights in the invention.

BACKGROUND

Since the discovery of massless Dirac transport in graphene, a single atomic layer of hexagonal carbon, there has been significant research activity in the use of graphene as a channel material in transistors. Its superior conductivity and high Fermi velocity (e.g., about $10^8$ cm/s, superior to most semiconductors saturation velocity<$2 \times 10^7$ cm/s) make it attractive. However, its zero or small bandgap<0.2 eV for bilayer or trilayer graphene makes it difficult to turn off a graphene channel, limiting the use of graphene to radio frequency (RF) applications, a space where other materials systems (e.g., InGaAs, InAlGaN, etc.) have been optimized and commercialized.

Graphene forms a highly asymmetric Schottky barrier when grown epitaxially on Si-face 4H—SiC. The barrier to holes is about 2.9 eV, while the barrier to electrons is about 0.3 eV. Moreover, this is the only natively grown Schottky material system to date, and has the potential for interfacial engineering to tune the barrier heights systematically through hydrogen intercalation at the SiC/graphene interface. This asymmetric, native tunable Schottky junction is ideal for bipolar-mode operation in semiconductor devices, as proposed by Amemiya et al, and illustrated in FIG. 2. This is due to the action of minority carriers, often ignored in Schottky device operation, an assumption that breaks down for asymmetric wide bandgap materials, whereas we will show experimentally that minority carriers dominate the behavior of these devices.

The injection of minority carriers can lead to conductivity modulation in diodes, as well as gain in a Schottky Emitter bipolar transistor, the subject of this paper. Moreover, the ultrathin graphene has essentially no series resistance, and there is no accumulated charge in the graphene itself. These lead to high frequency operation, and could enable graphene's use in power applications, as the breakdown voltage can now be dominated by the large 2.9 eV Schottky barrier. As a collector, the large p-type Schottky barrier leads to low leakage, enabling efficient charge collection that can also be engineered. Finally, the graphene/SiC material system is ideal for harsh environments due to the high temperature resistance of the materials, as well as the large barriers involved.

SUMMARY

Objects and advantages of the invention will be set forth in part in the following description, or may be obvious from the description, or may be learned through practice of the invention.

A bi-polar device is generally provided, along with methods of making the same. In one embodiment, the bi-polar device includes a semiconductor substrate doped with a first dopant, a semiconductor layer on the first surface of the semiconductor substrate, and a Schottky barrier layer on the semiconductor layer. The method of forming a bi-polar device includes, in one embodiment, forming a semiconductor layer on a first surface of a semiconductor substrate, where the semiconductor substrate comprises a first dopant and where the semiconductor layer comprises a second dopant that has an opposite polarity than the first dopant; and forming a Schottky barrier layer on a first portion of the semiconductor layer while leaving a second portion of the semiconductor layer exposed.

Other features and aspects of the present invention are discussed in greater detail below.

BRIEF DESCRIPTION OF THE DRAWINGS

A full and enabling disclosure of the present invention, including the best mode thereof to one skilled in the art, is set forth more particularly in the remainder of the specification, which includes reference to the accompanying figures.

Figure 1:
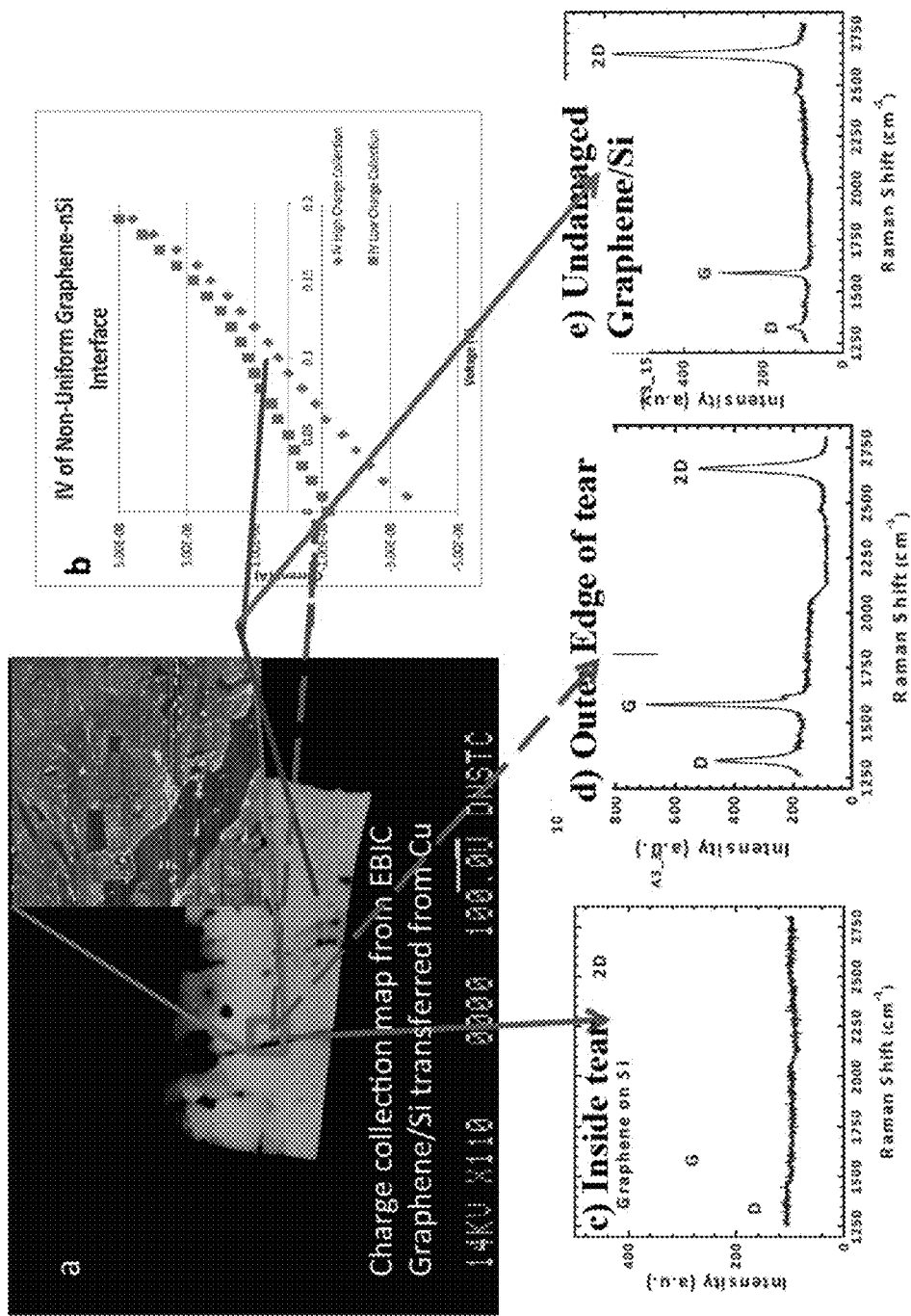
FIG. 1 shows: a) Electron beam induced current map at 0V applied across junction, and at 14 kV (penetration depth ~2 um), clearly showing lower charge collection at wrinkles and tears. The AFM image inset shows the morphology at low charge collection regions. b) Representative I-V characteristics under e-beam illumination at the spots shown. c-e) Raman spectra illustrating defect makeup at the various regions with different charge collection. The higher the D-peak, the higher the density of defects. These 3 correlated techniques enable complete characterization of electrically active defects.

Repeat use of reference characters in the present specification and drawings is intended to represent the same or analogous features or elements of the present invention.

Definitions

Chemical elements are discussed in the present disclosure using their common chemical abbreviation, such as commonly found on a periodic table of elements. For example, hydrogen is represented by its common chemical abbreviation H; helium is represented by its common chemical abbreviation He; and so forth.

In the present disclosure, when a layer is being described as "on" or "over" another layer or substrate, it is to be understood that the layers can either be directly contacting each other or have another layer or feature between the layers, unless expressly stated to the contrary. Thus, these terms are simply describing the relative position of the layers to each other and do not necessarily mean "on top of" since the relative position above or below depends upon the orientation of the device to the viewer.

Additionally, although the invention is not limited to any particular film thickness, the term "thin" describing any film layers of the photovoltaic device generally refers to the film layer having a thickness less than about 10 micrometers ("μm").

DETAILED DESCRIPTION

Reference now will be made to the embodiments of the invention, one or more examples of which are set forth below. Each example is provided by way of an explanation of the invention, not as a limitation of the invention. In fact, it will be apparent to those skilled in the art that various modifications and variations can be made in the invention without departing from the scope or spirit of the invention. For instance, features illustrated or described as one embodiment can be used on another embodiment to yield still a further embodiment. Thus, it is intended that the present invention cover such modifications and variations as come within the scope of the appended claims and their equivalents. It is to be understood by one of ordinary skill in the art that the present discussion is a description of exemplary embodiments only, and is not intended as limiting the broader aspects of the present invention, which broader aspects are embodied exemplary constructions.

A new class of semiconductor transistor devices is generally provided, which are based on graphene/SiC and graphene/Si Schottky junctions that have the potential to be transformative. By using the graphene as collector/emitter in a bipolar transistor (BJT) and not as a channel material, there is relaxation of the tolerances in graphene thickness and quality, simplifying growth, device design and fabrication. This design also enables the exploitation of engineered defects in thicker (e.g., 2 to about 100 monolayers, such as 2 to about 5 monolayers) graphene films for flexible electronics, currently not being considered, as well controlled uniform defects are preferred to localized random defect clusters.

Figure 6A:
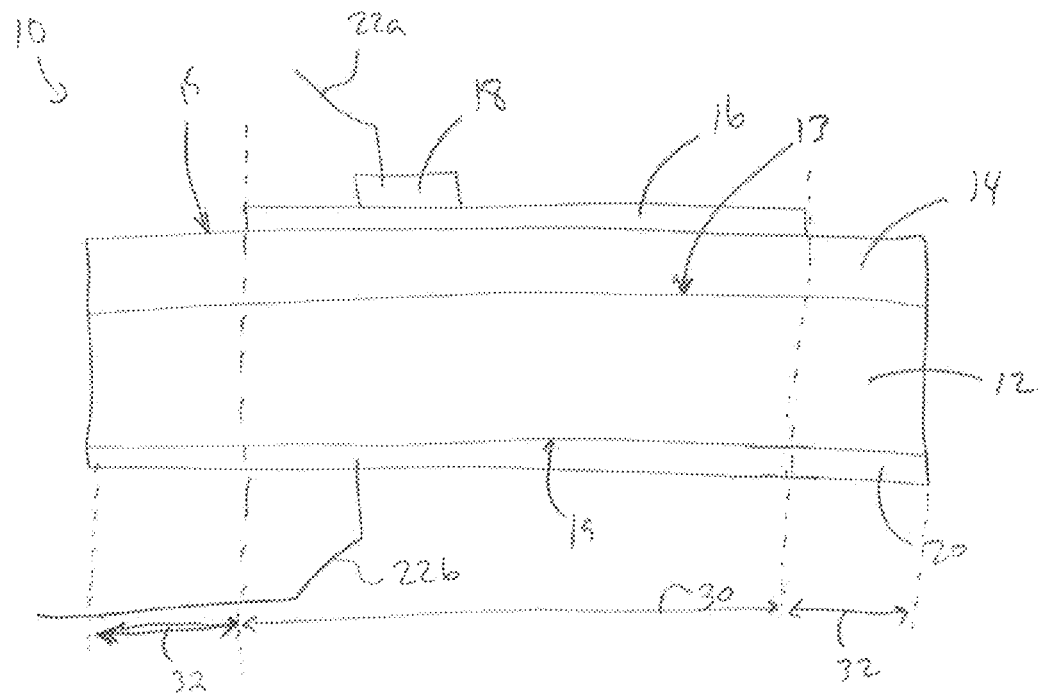
FIG. 6a shows a cross-sectional view of an exemplary device made according to one embodiment of the present invention.
Figure 6B:
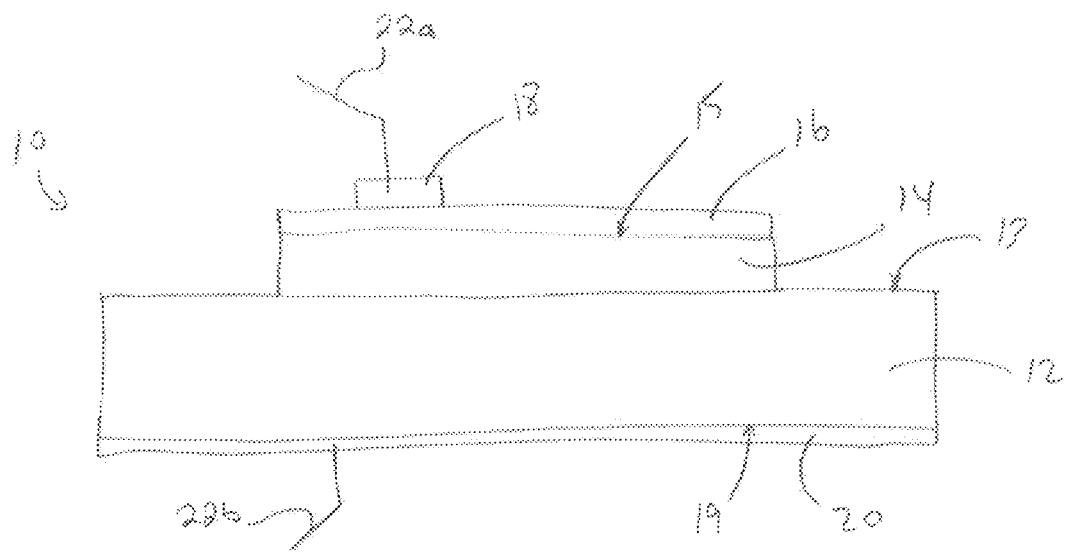
FIG. 6b shows a cross-sectional view of the exemplary device of FIG. 6A after etching, according to one embodiment of the present invention.

Referring to FIGS. 6A-6B, an exemplary bi-polar detector device 10 is generally shown before and after etching, as explained in greater detail below. The bi-polar detector device 10 employs a transistor design for high sensitivity detection of Ultraviolet (UV) and nuclear radiation. The highly transparent (97.7%) graphene layer (i.e., the graphene layer 16, described in greater detail below) provides a low-loss radiation window, while the transistor structure converts the incoming radiation into electric current and amplifies it (e.g., by greater than about 300×) to a usable level. The built-in amplification property makes the bi-polar detector device 10 suitable for a wide range of sensitive UV detection applications that include UV lamp control for sterilization and curing, UV analytical tools for scientific study, flame detection and missile tracking systems. On the other hand, the transistor itself can be adopted for power electronic systems, such as hybrid/electric cars and smart power grids.

Existing radiation and UV photo-detectors use a photo-diode structure (with no internal gain), the sensitivity of which is constrained by the background noise. The built-in bipolar gain in the bi-polar detector device 10 can overcome that limitation. Thus, the bi-polar detector device 10 is therefore ideal for applications that require high sensitivity UV light detection, such as flame sensing, UV spectroscopy, astronomy, and missile defense. Another large area of application is UV lamp control for sterilization, curing, personal tanning and water purification systems. Apart from UV applications, the transistor itself can be useful in power electronic systems that require large current densities. Potential applications include hybrid/electric vehicles, locomotive traction and HVDC transmission.

The bi-polar detector device 10, in particular embodiments can have at least one of the following distinctive advantages in UV and nuclear radiation detection applications. First, the radiation hardness and low leakage current of SiC makes enables long device lifetime and high sensitivity detection, respectively. Second, the transparency of the top graphene layer (97.7% irrespective of wavelength) to electromagnetic radiation makes it the best choice for the illumination window. Third, the built-in gain (>300) of the bi-polar detector device 10 eliminates the need of a separate amplifier stage, which is used in conventional detectors for boosting the low output signal to a usable level. Fourth, the use of a graphene/SiC junction significantly reduces the complexity and cost of the fabrication of a SiC transistor. Moreover, this technology renders an intrinsic, defect-free, reproducible material interface, which improves device reliability.

The device 10 generally includes a semiconductor substrate 12 defining a first surface 13 and a second surface 19. A semiconductor layer 14 is on the first surface 13 of the semiconductor substrate 12, and a Schottky barrier layer 16 is on the semiconductor layer 14. Generally, the semiconductor substrate 12 is doped with a first dopant, and the semiconductor layer 14 is doped with a second dopant such that the semiconductor substrate 12 has an opposite charge from the semiconductor layer 14 to form a Schottky junction.

Although described below as a device 10 having an n-type substrate 12 (i.e., a semiconductor substrate 12 doped with a first dopant, the first dopant being a n-type dopant) and a p-type layer 14 (i.e., a semiconductor layer 14 doped with a second dopant, the second dopant being a p-type dopant), it is to be understood that the polarities can be reversed in another embodiment. Also, the following description is directed to a Schottky barrier layer 16 formed of graphene (e.g., with the semiconductor layer 14 comprises SiC and/or another carbide). However, other materials suitable for the Schottky barrier layer may be utilized, as a function of the composition of the semiconductor layer 14 and/or semiconductor substrate 12.

In the embodiment shown, the p-type layer 14 is directly on the first surface 13 of the n-type substrate 12, and the graphene layer 16 is directly on the p-type layer 14. However, in other embodiments, an intermediate layer(s) can be positioned between the p-type layer 14 and the n-type substrate 12 and/or between the graphene layer 16 and the p-type layer 14. For example, one or more voltage blocking layers (also known as "drift layers"), which can be low-doped n-type layers, can be present between the p-type layer 14 and the n-type substrate 12.

The n-type substrate 12 is generally an extrinsic semiconductor substrate that has a larger electron concentration than hole concentration (i.e., being an electron-rich semiconductor material). The n-type substrate generally includes a semiconductor material and an n-type dopant. In particular embodiments, the semiconductor material comprises silicon carbide (SiC), and the n-type dopant comprises nitrogen (N), phosphorus (P), or combinations thereof. The SiC material can have any type of SiC, and in a particular embodiment is in the form of 4H—SiC. However, any semiconductor substrate can be utilized (instead of SiC), that is capable of forming a Schottky junction.

In most embodiments, the n-type dopant is present in the n-type substrate 12 at a dopant concentration of about $10^{17}$ atoms/cm$^3$ to about $10^{20}$ atoms/cm$^3$ (e.g., about $10^{18}$ atoms/cm$^3$ to about $10^{19}$ atoms/cm$^3$).

The n-type substrate 12 can have any suitable thickness depending on the particular device. For example, the n-type substrate 12 can have a thickness of about 100 μm to about 1,000 μm.

As stated, the p-type layer 14 is positioned on the first surface 13 of the n-type substrate 12. The p-type layer 14 is generally a semiconductor layer that has a larger hole concentration than electron concentration (e.g., being an electron-poor semiconductor material). The p-type layer 14 generally includes a semiconductor material and a p-type dopant. In particular embodiments, the semiconductor material comprises silicon carbide (SiC), and the p-type dopant comprises aluminium (Al), boron (B), gallium (Ga), beryllium (Be), vanadium (V), or combinations thereof. The p-type dopant can be present in the p-type layer 14 at a dopant concentration of about $10^{13}$ atoms/cm$^3$ to about $10^{18}$ atoms/cm$^3$ (e.g., about $10^{15}$ atoms/cm$^3$ to about $10^{16}$ atoms/cm$^3$).

The p-type layer 14 can be formed to a thickness of about 0.1 μm to about 100 μm (e.g., about 0.5 μm to about 10 μm). In one embodiment, the p-type layer 14 is grown as an epitaxial layer on the first surface 13 of the n-type substrate 12.

In particular embodiments, the p-type layer is an epilayer growth via chemical vapor deposition (CVD). For example, when comprising SiC, the p-type layer can be formed according to the methods described in U.S. Publication No. 2014/0231826 of Sudarshan, et al. and/or U.S. Publication No. 2013/0143396 of Sudarshan, et al., both of which are incorporated herein by reference.

In the embodiments where the n-type substrate and the p-type layer are both formed of SiC, the SiC of the layers can be the same, such as 4H—SiC, to form a homojunction. Alternatively, the SiC of the layers can be different forms of SiC to form a heterojunction. The use of a homojunction or a heterojunction applies to materials other than SiC also.

In the embodiment shown in FIG. 6A, the graphene layer 16 is positioned on the p-type layer 14 above a first portion 30 of its surface 15, leaving a second portion 32 of the its surface 15 exposed (i.e., without any graphene layer thereon). The embodiment of FIG. 6B shows that the second portions 32 of the p-type layer 14 being removed to leave the first surface 13 of the n-type substrate 12 exposed (i.e., without any p-type layer or graphene layer thereon) in those corresponding areas. As such, the working area of the device 10 is isolated on the n-type substrate 12.

In most embodiments, the graphene layer has a thickness of less than 5 individual graphene layers (e.g., about 1 graphene layer to about 5 graphene layers) such that the radiation (e.g., UV and/or nuclear) can pass therethrough for detection. Thus, the thickness of the graphene layer can be controlled by the number of individual graphene layers formed on or in the surface of the p-type layer. For example, the thickness of the graphene layer can be about 2 nm to about 20 nm, such as about 2 nm to about 10 nm. In one particular embodiment, the thickness of the graphene layer is about 2 nm to about 5 nm.

The graphene layer covers, in particular embodiments, only a portion of the first surface's surface area. The graphene layer can be formed through either a bottom-up or top-down approach, as known in the art using lithography.

The graphene layer can be sublimated onto the p-type layer, in certain embodiments. Generally, the graphene layer is grown via solid state decomposition, such as described in U.S. Publication No. 2014/0231826 of Sudarshan, et al.

Referring again to FIGS. 6A and 6B, a top contact 18 is positioned on a portion of the graphene layer 16, leaving the remaining area of the graphene layer exposed (i.e., without any top contact thereon). For example, the top contact 18 can cover only a portion of the graphene layer to leave the remaining graphene layer 16 exposed. The top contact 18 can be constructed from any suitable conductive material, such as nickel, and/or another metal. A top lead 22a is electrically connected to the top contact 18, but in some embodiments may be directly connected to the graphene layer without a top contact present.

A back contact 20 is shown on the second surface 19 of the n-type substrate 12. The back contact 20 can be constructed from any suitable conductive material, such as nickel and/or another metal. A back lead 22b is electrically connected to the back contact 20.

Methods of forming the bi-polar device described above are also generally provided. In one embodiment, the method includes: forming a p-type layer on a first surface of a n-type substrate; forming a graphene layer on a first portion of the p-type layer, while leaving a second portion of the p-type layer exposed; and applying a top contact onto a portion of the graphene layer. The method can further include: removing the second portion of the p-type layer from the first surface of the n-type substrate.

Figure 10:
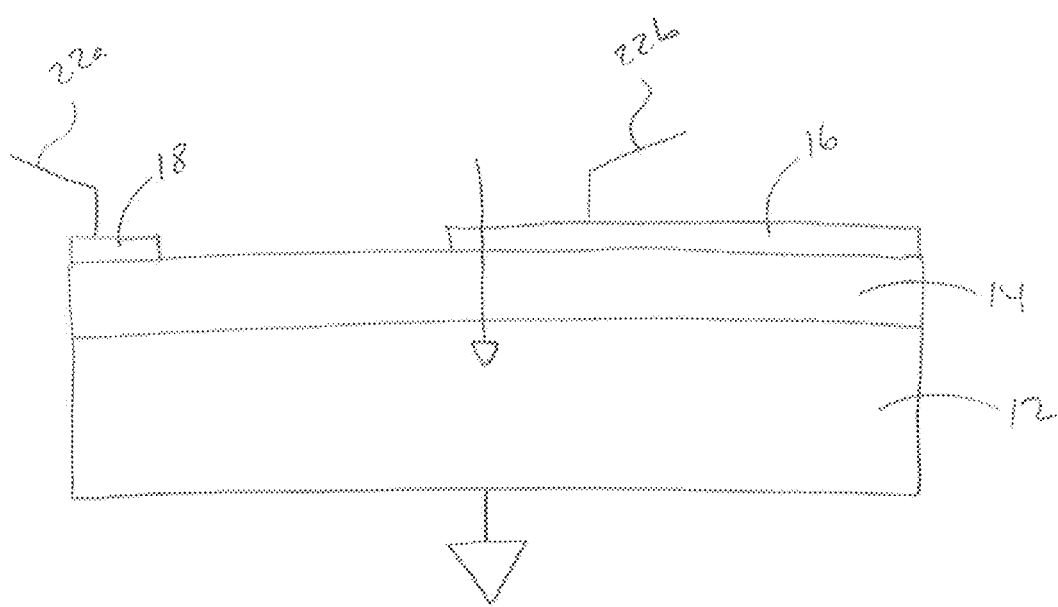
FIG. 10 shows an exemplary device made according to one embodiment of the present invention.

Referring to FIG. 10, another embodiment of the bi-polar detection device 10 is generally shown in the active path. The bi-polar detection device 10 includes a semiconductor substrate 12, a semiconductor layer 14, and a Schottky barrier layer 16. These layers are described in greater detail above. In the active path shown, the semiconductor substrate 12 serves as the emitter while the Schottky barrier layer 16 serves as the collector. In reverse action (not shown), these rolls reverse such that the semiconductor substrate 12 serves as the collector while the Schottky barrier layer 16 serves as the emitter.

Example 1

Figure 7A:
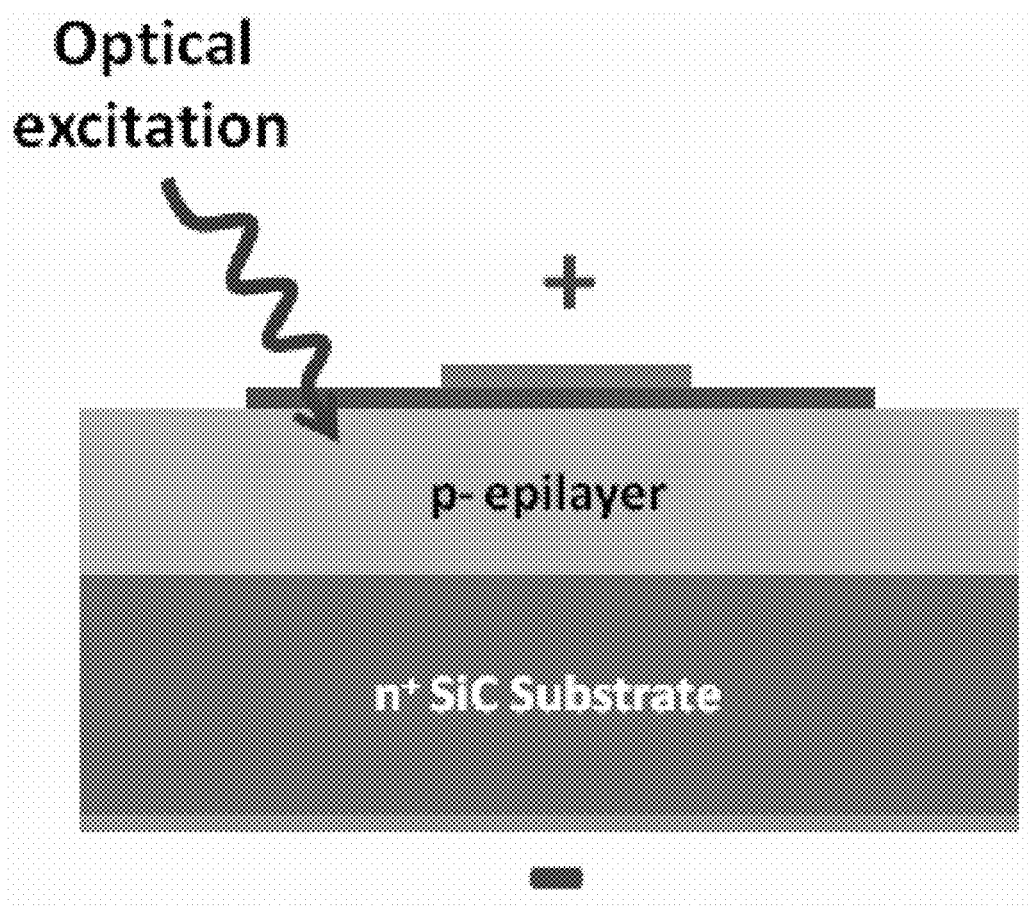
FIG. 7a shows a cross-sectional view of the exemplary device of FIG. 6A upon optical excitation in a forward active mode.
Figure 7B:
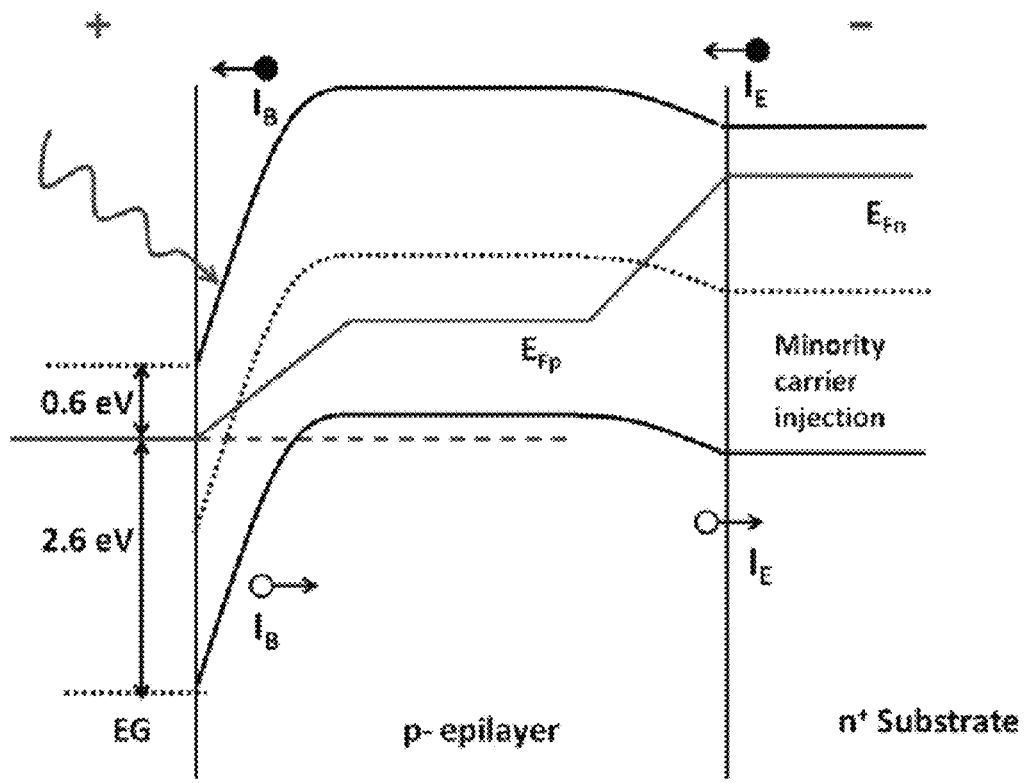
FIG. 7b shows the energy band diagram according to Example 1.
Figure 8A:
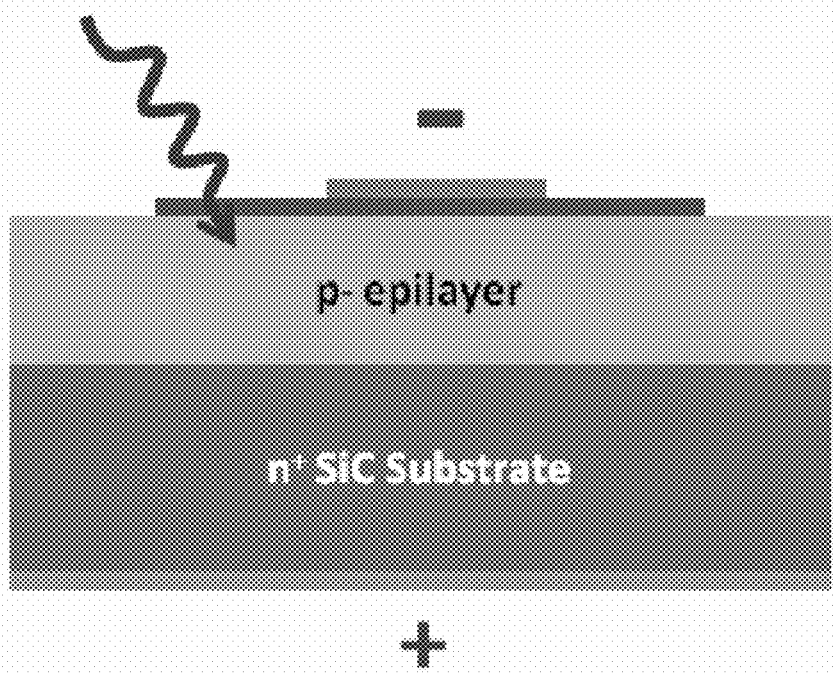
FIG. 8a shows a cross-sectional view of the exemplary device of FIG. 6A upon optical excitation in a reverse active mode.
Figure 8B:
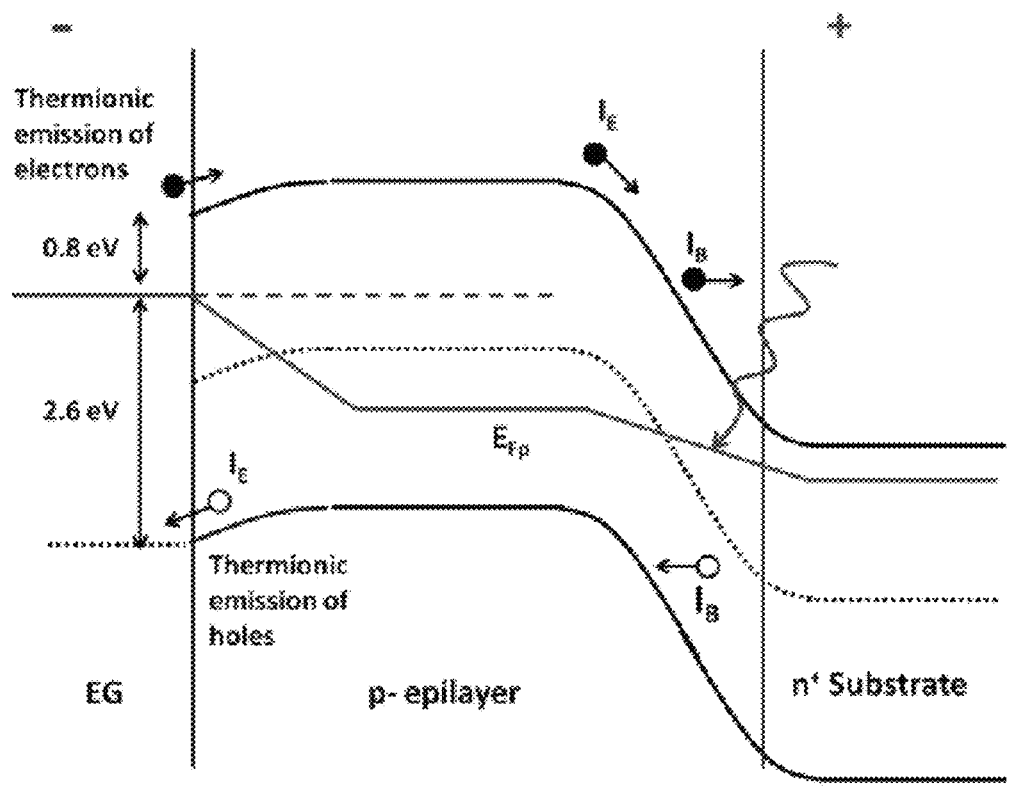
FIG. 8b shows the energy band diagram according to Example 1.

A bipolar junction transistor was made having three material layers: (1) n+ doped 4H—SiC substrate, (2) p-doped 4H—SiC epitaxial layer, and (3) Epitaxial few layers of graphene (FLG). The device structure schematic is shown in FIGS. 7a and 8a. The n+ 4H—SiC substrate was purchased from Cree, Inc. The p-doped 4H—SiC epitaxial layer was grown by chemical vapor deposition (CVD). The epitaxial graphene (FLG) layer was grown by the sublimation of the p-SiC epilayer surface. The device area was defined by selectively etching the FLG film by Oxygen plasma. For contacting the FLG layer, a Ni top contact was selectively deposited using photolithography. The FLG layer can alternatively contacted directly using a test probe. A large area, unannealed Ti/Au bottom contact was deposited on the back of the n+ substrate layer.

When a bias was applied between the top and the bottom contact, the structure shows the electrical characteristics of an n-p-n bipolar junction transistor. The p-epilayer/n+ substrate acts as the emitter junction while the FLG/p-epilayer forms the collector junction. The base current was provided optically using electron beam or alternatively by ultraviolet (UV) illumination. The structure shows current gain in both forward active and reverse active mode, i.e., the FLG/p-SiC hetero-junction is capable of operating as both emitter and collector. The bipolar mode operation of the FLG/p-SiC junction was the first demonstration of its capability of injecting minority carriers (in this case electrons) over the Schottky barrier (~2.6 eV) formed at the junction. The modes of operation along with the energy band diagrams are shown in FIGS. 7a, 7b, 8a, and 8b.

Figure 9A:
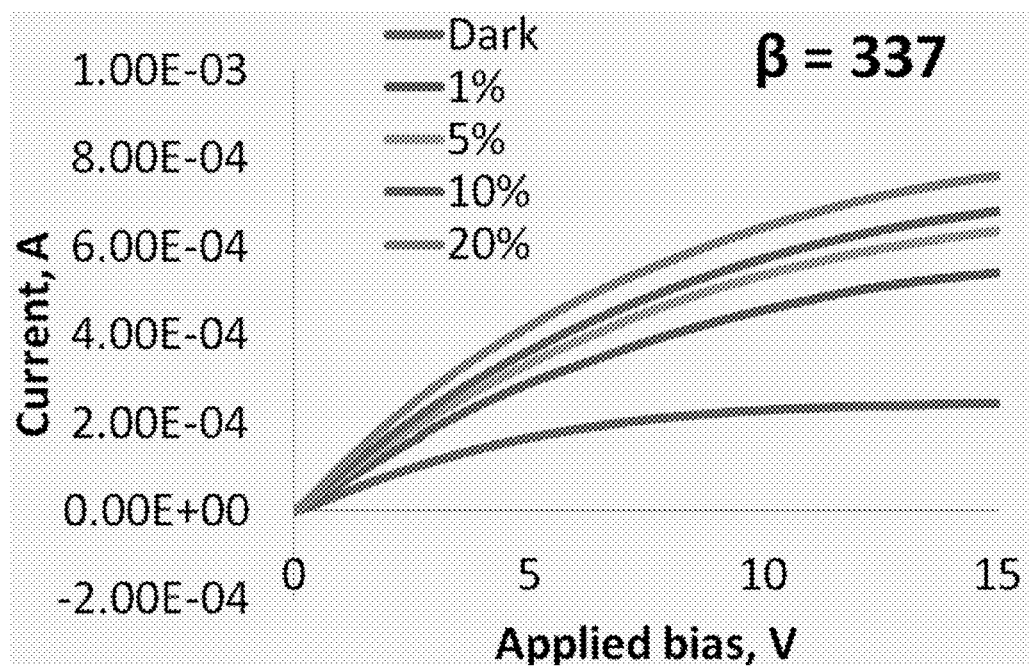
FIG. 9a shows the forward active mode characteristics of the device of FIG. 7a according to Example 1.
Figure 9B:
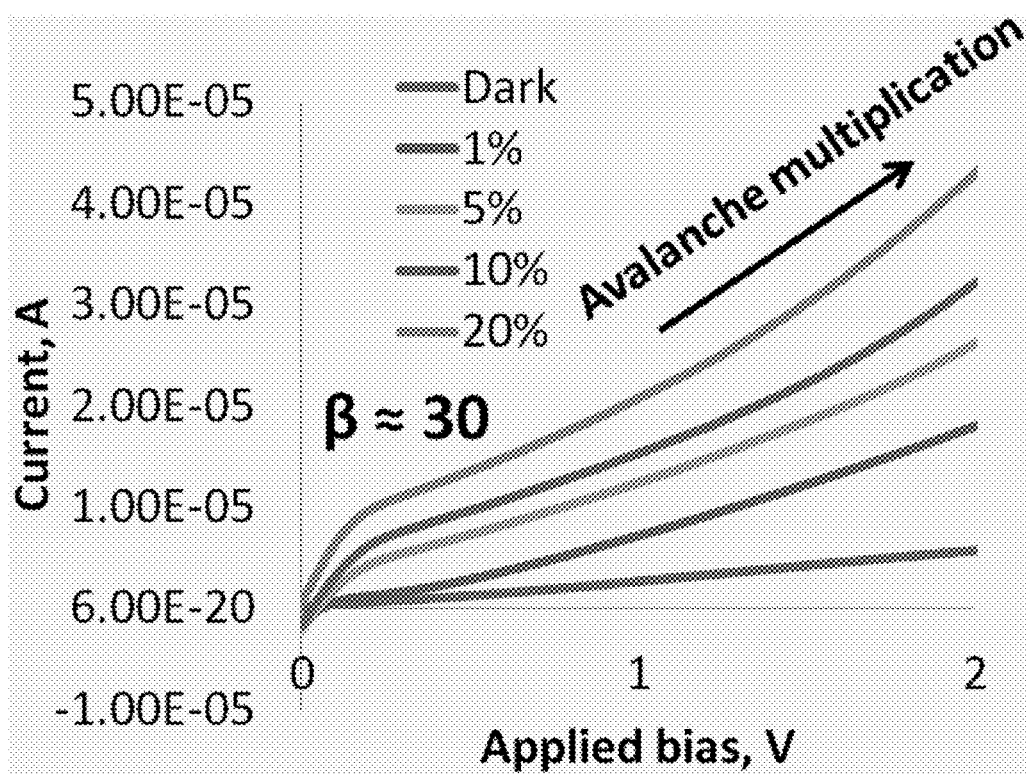
FIG. 9b shows the reverse active mode characteristics of the device of FIG. 8a according to Example 1.

The fabricated device showed common emitter current gain (beta) values exceeding 300 in the forward active mode (FLG/SiC collector). In the reverse active mode (FLG/SiC emitter), a maximum common emitter current gain of 30 was observed. However, for high bias voltages avalanche breakdown of the collector junction takes place and an avalanche multiplication of up to 1000× was observed. The collector current (Ic) vs collector-emitter voltage ($V_{ce}$) for both modes of operation are given in FIG. 9a (forward) and FIG. 9b (reverse).

Example 2

We discuss below a $SiF_4$ based growth method that enables temperature programmed defect engineering. We also discuss below the use of electron-beam induced current (EBIC) to characterize these materials. Based on recent results at our lab, a graphene/SiC Schottky junction behaves as a collector (GC) and an emitter (GE) in a BJT with common emitter gain, β>50, measured under phototransistor operation mode. The transparent graphene Schottky collector/emitter junction enables optoelectronic applications, minimizes series resistance in the device due to the thin graphene layer, and also minimizes charge storage time (diffusion capacitance), enabling high speed operation. Furthermore, the observation of β>50 with a GEBJT demonstrates that significant minority carrier injection occurs in these Schottky junctions, contrary to what is commonly assumed. The injection of minority carriers has the ability to induce conductivity modulation in the underlying semiconductor, reducing overall device resistance. The role of minority carriers in Schottky Junctions is also discussed below.

FIGS. 1-5 and Table 1 relate to this Example.

EXPERIMENTAL

A. Growth of Epitaxial Graphene

Nitrogen doped (about $10^{19}$ cm$^{-3}$), chemo-mechanical polished (CMP), commercial 4H—SiC substrates were used, with about $10^{15}$ cm$^{-3}$ 10 μm thick SiC epitaxial layers. P-type layers were used for the bipolar structures, whereas n-type layers were used for calibration. Samples were cleaned by standard RCA cleaning method. Epitaxial graphene (EG) growths were performed either in a vacuum furnace for inert ambient [4] (Temperature of about 1350° C., pressure of about $10^{-6}$ Torr, 1 hour growth time) or in a vertical hot-wall CVD reactor for $SiF_4$ assisted growth of defect engineered graphene (DEG). For DEG, new graphite parts are used and properly baked at 1600° C. before loading the sample to remove any residual contamination in the reactor parts. Ultra high purity (99.9999%) Ar gas was used as the carrier gas. The substrate was first baked at 750° C. in vacuum. Then Ar carrier gas flow was initiated to attain the growth pressure (300 torr). The growth temperature (e.g., about 1300° C. to about 1600° C.) was reached in about 20 minutes, at which point 0.1% SiF4 flow (Tetrafluorosilane or TFS) was initiated for the graphene growth. Finally, the temperature was ramped down from the growth temperature in about 20 minutes to minimize thermal stresses. No pre-growth hydrogen etch was performed.

B. Material Characterization

The surface morphology of these films was characterized by atomic force microscopy (AFM) after each growth. Tapping mode was used to scan 5 μm×5 μm window at several positions on a sample.

A micro-Raman setup with laser excitation wavelength at 632 nm and a spot size of about 2 μm was used to obtain the Raman spectra of the graphene samples. The Raman system was calibrated using the known Si peak at 520.7 cm$^{-1}$. Reference blank substrate spectra were scaled appropriately and subtracted from the graphene spectra to show only the graphene peaks. All the spectra shown in this paper are difference Raman spectra obtained in this manner. The Raman spectrum of graphene has three peaks, called the G-peak, intrinsic to graphene/graphite at about 1580 cm$^{-1}$, the disorder induced D-peak at about 1350 cm$^{-1}$ and the second order 2D peak, which is present in ideal graphene. For films less than about 35 ML thick, the thickness was extracted using X-ray photoelectron spectroscopy (XPS). For films greater than 35 ML, we use Fourier Transform Infrared Reflectance (FTIR) to obtain the thickness.

C. Device Fabrication/Characterization

Devices were fabricated using standard photolithographic techniques. An oxygen plasma was used to isolate the graphene Schottky contacts, of sizes from about 100 to about 300 µm in diameter. Ti/Au metal back contacts were evaporated. The devices were characterized electrically using current-voltage (I-V) and capacitance-voltage (C-V), with probes directly contacting the graphene. C-V clearly showed a small graphene/SiC SChottky barrier about 0.3 eV to n-type SiC, and greater than 2 eV to p-type SiC from the $1/C^2$ intercept.

D. Electron Beam Induced Current (EBIC)

Electron beam induced current (EBIC) is a technique where an electron beam with energy 10 to 30 keV (depth of about 0.3 to about 3 µm) hits a semiconductor inside a scanning electron microscope (SEM), generates e-h pairs, which are then collected be a potential built in electric field, giving rise to a measurable current, called EBIC. This EBIC is controllable by changing the bias across the device (VCE in FIG. 2). EBIC is sensitive to local defects less than about 1 nm (e.g. threading dislocations in SiC), and can be mapped in the SEM to actively image electrical active defects (FIG. 1). This shows how tears and imperfections induced during graphene transfer from Cu to Si can cause local defects that deteriorate charge collection EBIC signal. These charge collection maps can be correlated with Raman-defects (which are more structural/chemical in nature) to determine which defects are electrically active. This can also be correlated with nanoscopic morphology using (AFM). We generally observe that SiC grown graphene appears to be relatively electrically-active defect-free, while that on Si contains defects from transfer. The trade-off is that there is much more statistical scatter in SiC-grown graphene devices, whereas in Si-transferred devices, defects can be more evenly distributed enabling better control of device performance.

We observe that SiC grown graphene appears to be relatively electrically-active defect-free, while that on Si contains defects from transfer. The trade-off is that there is much more statistical scatter in SiC-grown graphene devices, whereas in Si-transferred devices, defects can be more evenly distributed enabling better control of device performance. In this study, we focus exclusively on SiC/graphene interfaces, as these are the ones suitable for the bipolar mode operation described above.

Results and Discussion

A. Graphene as a Collector in SiC BJT Devices

Figure 2A:
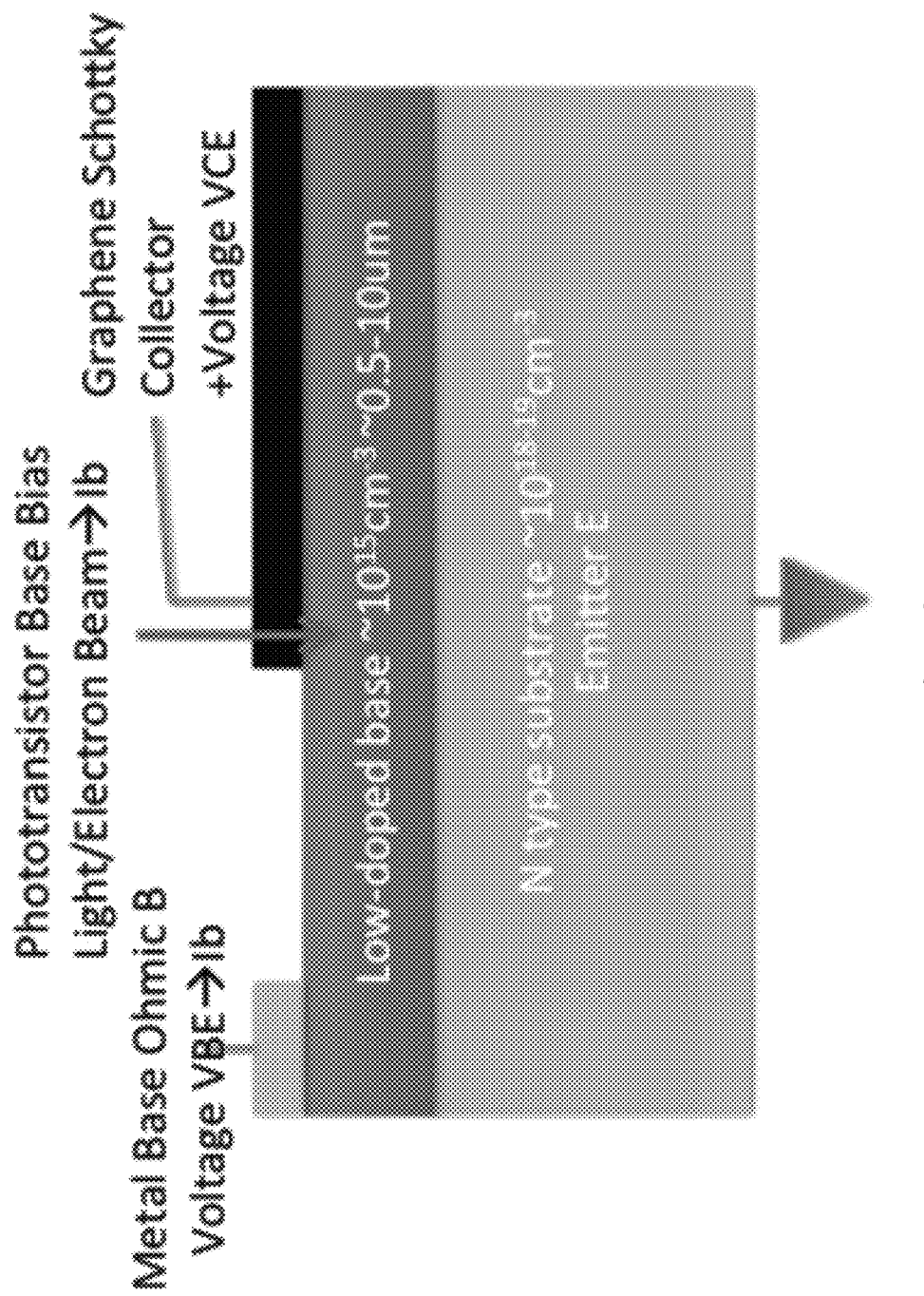
FIG. 2a shows a GC-BJT structure for Si and SiC substrates, according to the Examples, with the base current being through the BC junction in phototransistor mode.
Figure 2B:
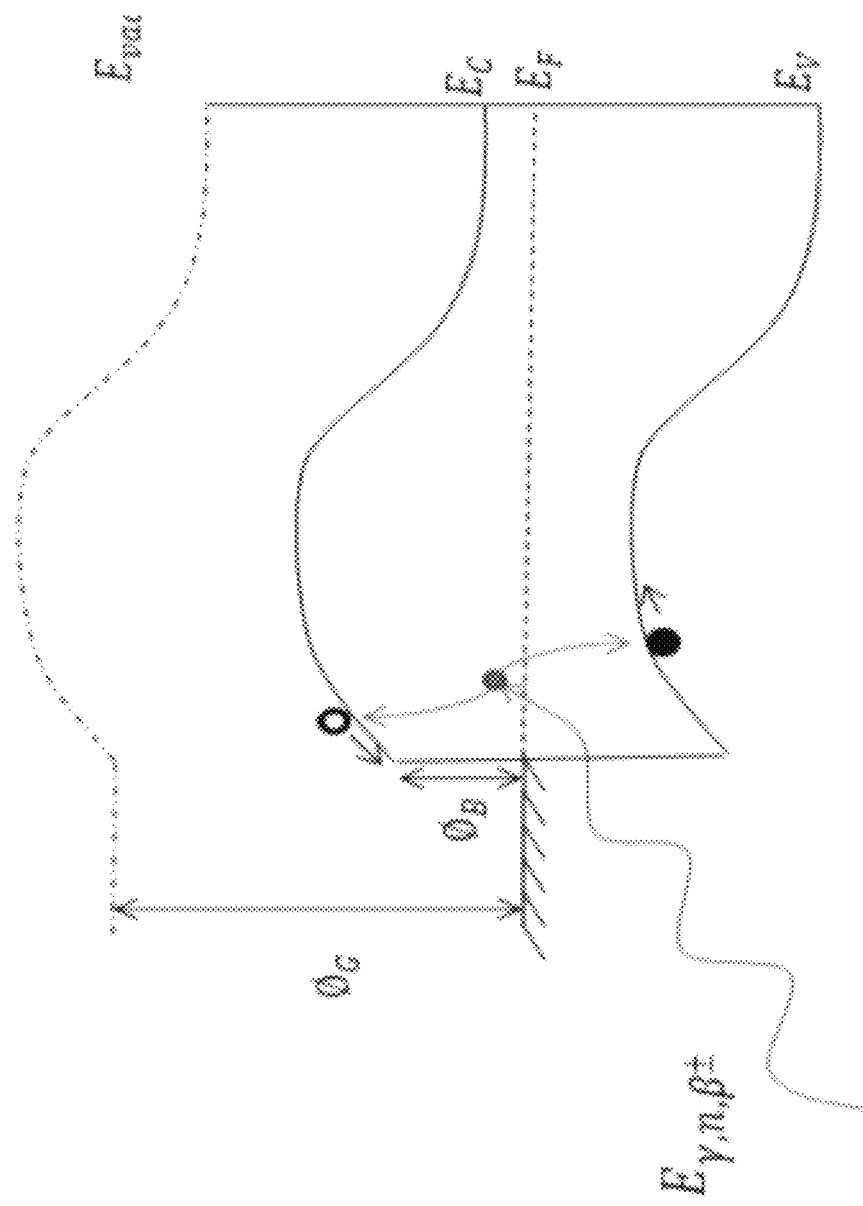
FIG. 2b shows a band structure and the operating principle of this novel device. The two reasons it works are i) High barrier of graphene to p-SiC (measured to be greater than 2 eV), which minimizes leakage current and ii) the big doping difference between SiC base and emitters.
Figure 3:
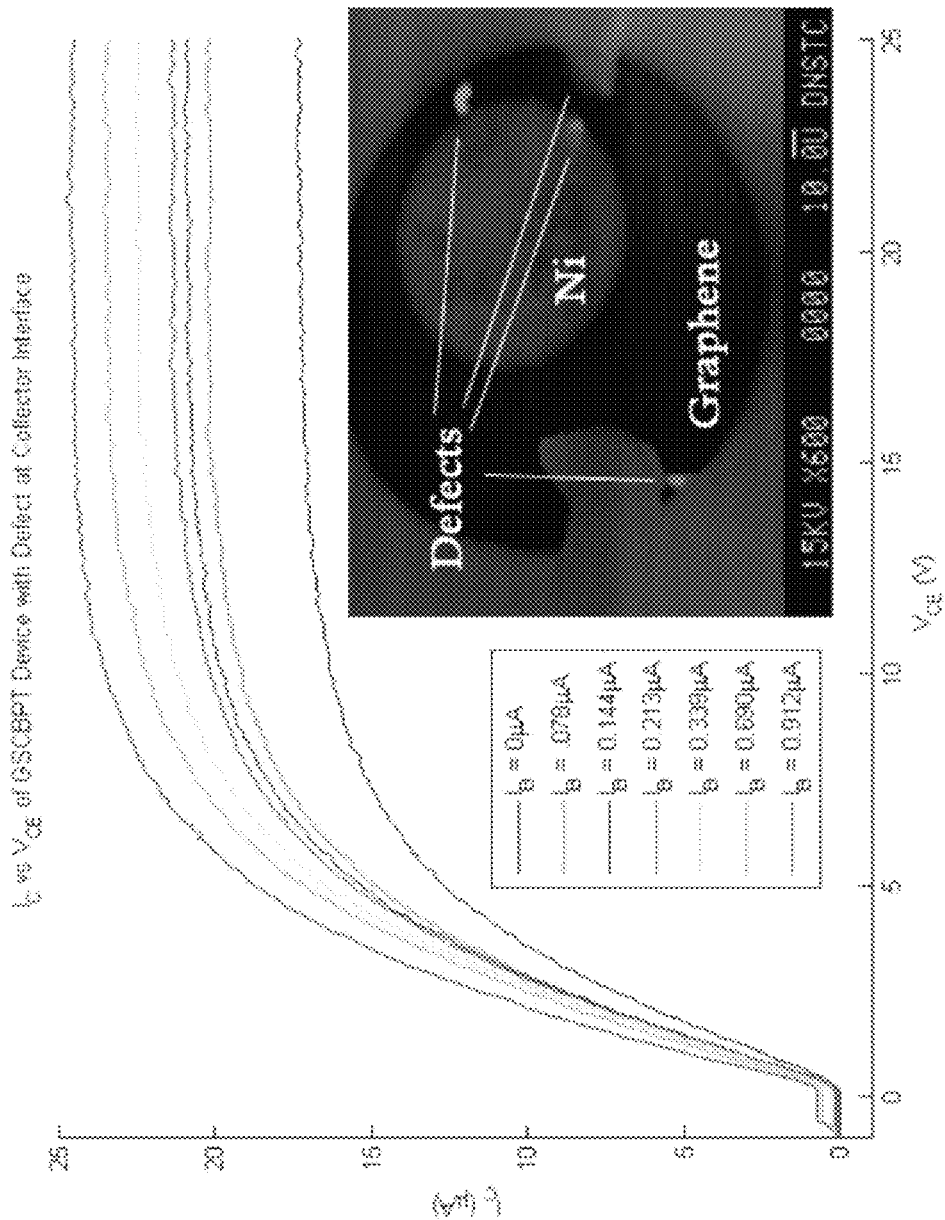
FIG. 3 shows a phototransistor family of curves as a function of EBIC generated base current. The clear current saturation, as expected in forward active mode is clearly seen. Active mode gain as high as 50 is measured.

With n-type graphene/SiC Schottky structures, very typical "solar-cell" type behavior (FIG. 1 above) was obtained under electron beam illumination. However, with p-type epitaxial layers on n-type substrates, unexpected results were obtained (FIG. 3). The current in response to electron beam illumination measured under forward bias was much higher than expected, and current saturation was observed. Upon further analysis, we realized that we had created a bipolar transistor structure with a Schottky collector. The band diagram is illustrated in FIG. 2. The characteristics in FIG. 3 are consistent with such behavior, and indicated a current gain as high as 50×, although the dark current appears to be controlled by defects and imperfections at the graphene/SiC interface. We also obtained Early Voltages as high as 600V. The gain here is given by:

$$\beta = \frac{D_n}{W_B S}$$

where $D_n$ is the electron base diffusion constant; $\tau_n$ is the recombination time: S is the graphene/SiC interfacial (FIGS. 2,4) recombination velocity; and while $W_B$ is about 10 µm as the base width. In this device, e-h pairs are generated at the p-SiC/graphene Schottky collector junction. The electrons go down the potential well and into the circuit, while holes are trapped in the low doped p-base layer (doping of about $10^{15}$ cm$^{-3}$, 10 µm thick). This lowers the potential in the base, injecting electrons from the high-doped emitter substrate. Because the doping is higher in the emitter substrate, gain is obtained. Our initial analysis indicates that this current gain is limited by recombination at the p-SiC/graphene Schottky interface with a recombination velocity varying from about $10^3$ to about $10^4$ cm/s (response time estimated to be about 10 ns), consistent with values reported for SiC surfaces and other Schottky/SiC interfaces. We are investigating the physics of this device. Reducing the thickness of the base from about 10 µm to about 2.5 µm should quadruple the gain to β>100.

B. Graphene as an Emitter in SiC BJT Devices

Figure 4A:
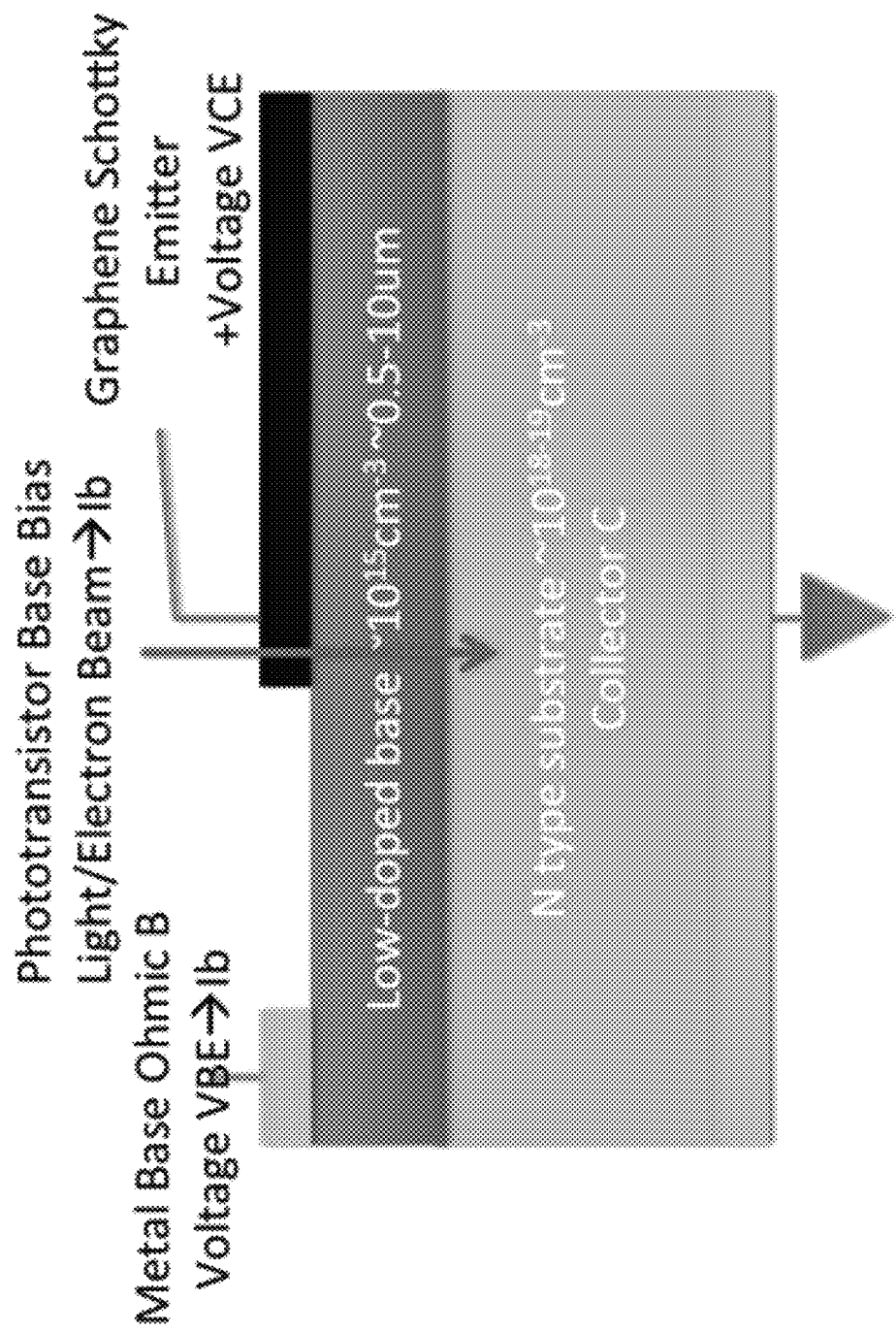
FIG. 4a shows a graphene emitter-BJT structure. The key difference is that in phototransistor mode, the base current must be injected at the substrate/epi pn junction, rather than at the Schottky contact.
Figure 4B:
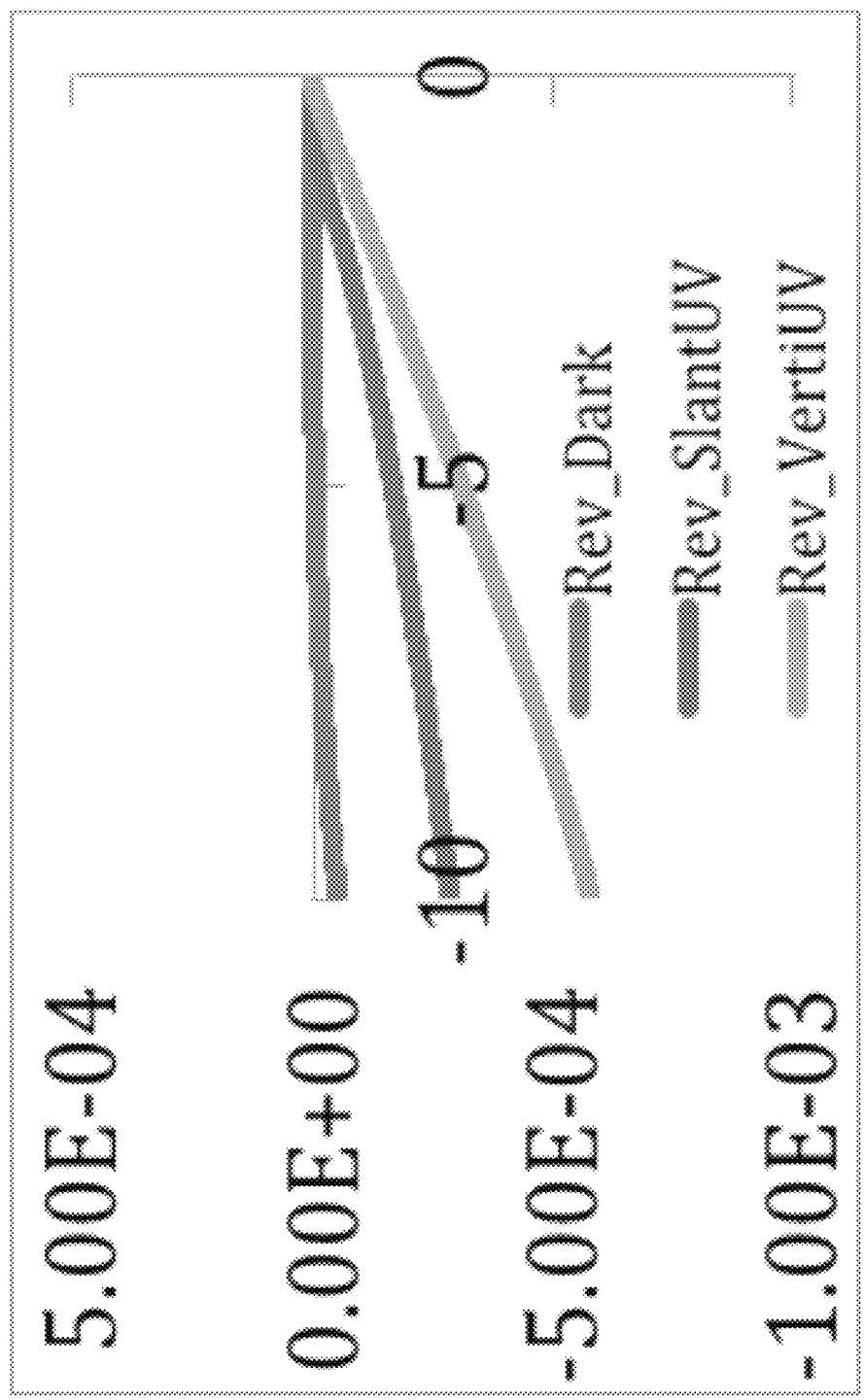
FIG. 4b shows the IV characteristics of graphene-emitter bipolar phototransistor showing current gain as high as 52×. The negative voltage/current is with respect to the device in FIG. 2.

Measurements using UV light (365 nm, SiC penetration depth about 10 µm) were performed, similar to the EBIC measurements described above. This causes generation of current at the buried SiC pn junction, rather than the graphene/SiC Schottky junction described above, making graphene the emitter in this structure. In this mode, we measured common emitter current gain as high as 53×, the first time any gain has ever been reported in a phototransistor using a Schottky junction at the emitter (FIG. 4). The measurement of such large current indicates that the emitter injection efficiency must be close to about 1 (i.e. most of the carriers injected from the emitter are minority electrons, and not majority holes). We attribute this to the very small barrier to the minority electrons (less than 0.5 eV, measured by C-V) and the very large barrier (greater than 2.5 eV by C-V) to holes, which suppresses thermionic emission of holes, and enables thermionic emission of electrons. Initial calculations show that this asymmetric barrier can explain the highly efficient minority carrier injection. By holding the electron barrier at 0.3 eV, and reducing the bandgap from 3.2 eV (4H—SiC) down to 2 eV, the minority injection efficiency decreases from about 95% to less than about 10%, which is why this high injection efficiency has not been observed widely in Schottky junctions.

C. Defect/Interfacial Engineering in Epitaxial Graphene

The best quality material for nano-electronics has been obtained systematically through the solid-state decomposition of the surface of commercial SiC substrates as described in the experimental section. In this technique, the substrate is heated to high temperatures about 1300° C. to about 1650° C., either in a vacuum, or in an inert environment such as Argon. The Si vapor pressure at the surface, being higher than that of carbon, leads to the loss of Si from the surface, and the formation of a C-rich layer on the SiC surface according to reaction 1 (Table 1).

This C-rich layer can then rearrange itself into a perfect graphene crystal, if enough time is available for the bonds to form. The thickness is controlled by changing the temperature and time, as well as the choice of SiC substrate orientation.

Figure 5A:
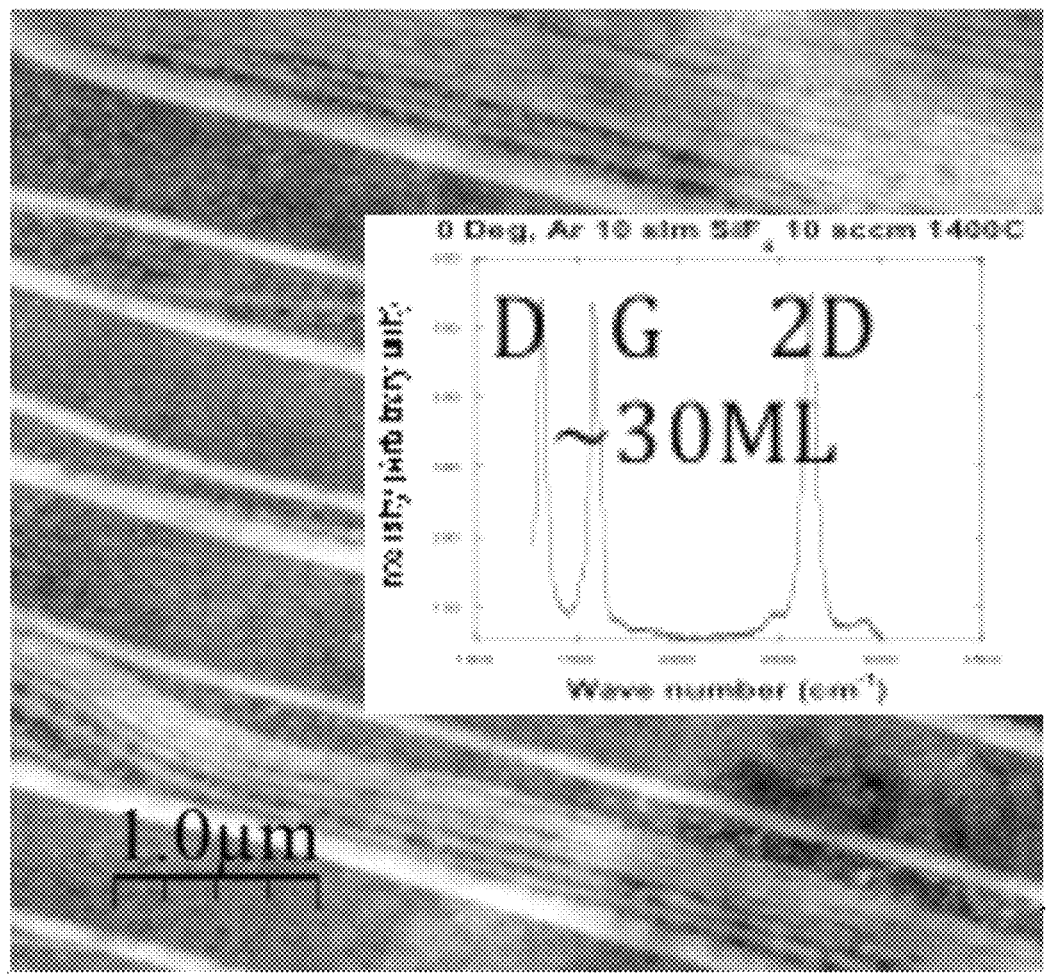
FIG. 5a shows atomic force micrographs (AFM) of defect engineered graphene (DEG) at 1400° C. growth temperature on Si-face SiC. The insets are Raman spectra of the film.
Figure 5B:
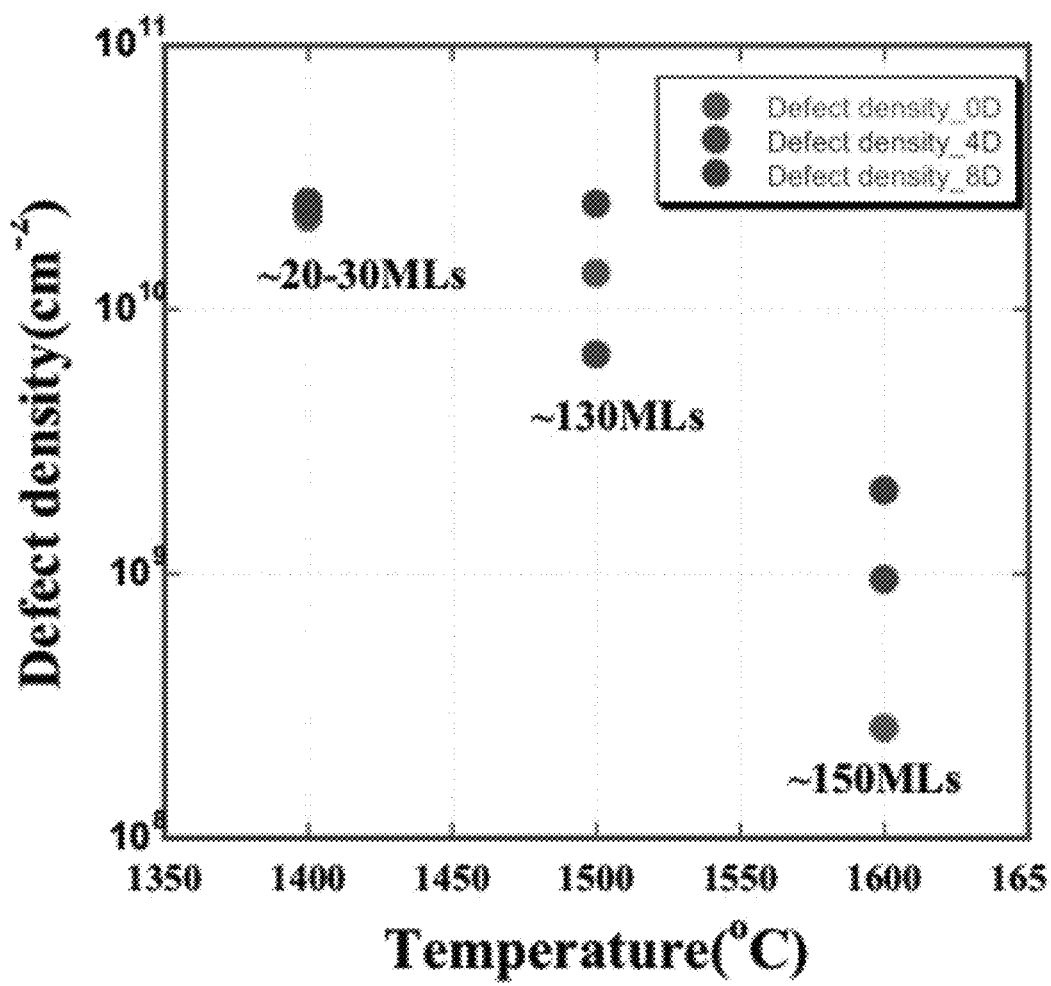
FIG. 5b shows the defect density of DEG extracted by Raman, showing how defect engineering is achieved by changing temperature and SiC orientation (0-8°). Increasing the growth temperature decreases the defect density, as there is more energy available for the formation of C—C bonds. Growing on on-axis (0°) SiC generally gives lower defect densities. DEG shows turbostratic stacking, while EG shows Bernal stacking. The best EG layers show Raman D/G ratio<<0.05, corresponding to defect densities less than about $10^8$ cm$^{-2}$, similar to the best EG layers here and at the state of the art in the field.

To accelerate graphene growth in a predictable manner with greater controllability of defect profile, a controllable Si removal process by some precursor gas is needed. SiF$_4$ is known to forming SiF$_2$ (g) by reacting with solid Si at above 1150° C. (Table 1, reaction 2). Here we show that, SiF$_4$ selectively removes Si from the surface without etching the carbon, enabling faster growth of graphene. Si removal from the surface is more favorable (ΔG=15.9 kcal/mol, reaction 2) by using SiF$_4$ compared to the thermal evaporation reaction (ΔG=42.6 kcal/mol, reaction 1b) normally used for EG growth. With this process, layers greater than 100 ML have been demonstrated, with defect densities controllable by temperature (FIG. 5b).

This defect engineering is another tool to control the SiC/graphene SChottky interface, as the density of defects will influence the SChottky barrier height, as well as minority carrier injection.

Table 1 shows the free formation energy (kcal/mol) for various reactions calculated using thermochemical data.

| Reaction | | 1800 K | 1900 K | 2000 K |
|---|---|---|---|---|
| Dissociation and evaporation reactions | | | | |
| 1 | SiC(s) → Si(g) + C(s) | 58.19 | 54.60 | 51.183 |
| 1a | SiC(s) → Si(l) + C(s) | 12.90 | 12.00 | 11.116 |
| 1b | Si(l) → Si (g) | 45.29 | 42.59 | 39.904 |
| SiF$_4$ reaction | | | | |
| 2 | Si (l) + SiF$_4$ → 2SiF$_2$ (g) | 19.69 | 15.93 | 12.22 |

These and other modifications and variations to the present invention may be practiced by those of ordinary skill in the art, without departing from the spirit and scope of the present invention, which is more particularly set forth in the appended claims. In addition, it should be understood the aspects of the various embodiments may be interchanged both in whole or in part. Furthermore, those of ordinary skill in the art will appreciate that the foregoing description is by way of example only, and is not intended to limit the invention so further described in the appended claims.

What is claimed:

1. A bi-polar device, comprising:
a semiconductor substrate doped with a first dopant, wherein the substrate defines a first surface and a second surface;
a semiconductor layer on the first surface of the semiconductor substrate; and
a Schottky barrier layer on the semiconductor layer,
wherein the Schottky barrier layer is positioned above a first portion of the first surface of the semiconductor substrate, leaving a second portion of the first surface of the semiconductor substrate without any Schottky barrier layer thereon,
and wherein the semiconductor layer is positioned between the Schottky barrier layer above the first portion of the first surface of the semiconductor substrate, and wherein the second portion of the first surface of the semiconductor substrate is without any semiconductor layer thereon.

2. The device as in claim 1, wherein the semiconductor substrate comprises SiC, and wherein the first dopant is an n-type dopant.

3. The device as in claim 2, wherein the n-type dopant comprises N, P, or combinations thereof.

4. The device as in claim 2, wherein the first dopant is present in the semiconductor substrate at a dopant concentration of about $10^{17}$ atoms/cm$^3$ to about $10^{20}$ atoms/cm$^3$.

5. The device as in claim 2, wherein the semiconductor substrate has a thickness of about 100 μm to bout 1,000 μm.

6. The device as in claim 1, wherein the semiconductor layer comprises SiC, and wherein the semiconductor layer includes a second dopant, which is a p-type dopant.

7. The device as in claim 6, wherein the p-type dopant comprises aluminium, boron, gallium, beryllium, or combinations thereof.

8. The device as in claim 6, wherein the second dopant is present in the semiconductor layer at a dopant concentration of about $10^{13}$ atoms/cm$^3$ to about $10^{18}$ atoms/cm$^3$.

9. The device as in claim 6, wherein the semiconductor layer has a thickness of about 0.1 μm to about 100 μm.

10. The device as in claim 1, wherein the semiconductor layer is directly on the first surface of the semiconductor substrate.

11. The device as in claim 1, wherein the Schottky barrier layer is directly on the semiconductor layer, and wherein the Schottky barrier layer has a thickness of 1 monolayer to about 5 monolayers.

12. The device as in claim 1, wherein the Schottky barrier layer comprises graphene.

13. The device as in claim 1, wherein the second portion of the first surface of the semiconductor substrate is exposed.

14. The device as in claim 1, further comprising a top contact on the Schottky barrier layer.

15. The device as in claim 14, wherein the top contact comprises nickel.

16. The device as in claim 14, wherein the top contact is positioned on a first portion of the Schottky barrier layer, leaving a second portion of the Schottky barrier layer without any top contact thereon.

17. The device as in claim 1, further comprising:
a top lead electrically connected to the top contact and/or the Schottky barrier layer.

18. The device as in claim 1, further comprising:
a back contact on the second surface of the semiconductor substrate.

19. The device as in claim 18, further comprising:
a bottom lead electrically connected to a bottom contact.

20. A method of forming the bi-polar device of claim 1, the method comprising:
forming a semiconductor layer on a first surface of a semiconductor substrate, wherein the semiconductor substrate comprises a first dopant, and wherein the semiconductor layer comprises a second dopant that has an opposite polarity than the first dopant; and
forming a Schottky barrier layer on a first portion of the semiconductor layer, while leaving a second portion of the semiconductor layer exposed.

21. The method as in claim 20, further comprising:
applying a top contact onto a portion of the Schottky barrier layer.

22. The method as in claim 20, further comprising:
removing the second portion of the semiconductor layer from the first surface of the semiconductor substrate.

23. The method as in claim 20, wherein the semiconductor substrate defines a second surface opposite from the first surface, and wherein a back contact is present on the second surface of the semiconductor substrate.

24. The method as in claim 20, wherein the semiconductor layer comprises SiC, and wherein the semiconductor layer comprises SiC, and further wherein the Schottky barrier layer comprises graphene.

25. The method as in claim 20, wherein the first dopant is an n-type dopant, and wherein the second dopant is a p-type dopant.

\* \* \* \* \*